(12) United States Patent
Sharma et al.

(10) Patent No.: US 7,272,808 B1
(45) Date of Patent: Sep. 18, 2007

(54) ON-CHIP VARIABILITY IMPACT SIMULATION AND ANALYSIS FOR CIRCUIT PERFORMANCE

(75) Inventors: Mahesh S. Sharma, Austin, TX (US); David M. Newmark, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 203 days.

(21) Appl. No.: 11/147,782

(22) Filed: Jun. 8, 2005

(51) Int. Cl.
*G06F 9/45* (2006.01)
*G06F 17/50* (2006.01)

(52) U.S. Cl. .................................................. 716/6
(58) Field of Classification Search ................ 716/5–6
See application file for complete search history.

(56) References Cited

U.S. PATENT DOCUMENTS

| | | | | |
|---|---|---|---|---|
| 5,198,986 A * | 3/1993 | Ikeda et al. | ..................... | 716/5 |
| 6,099,582 A * | 8/2000 | Haruki | ..................... | 716/11 |
| 6,158,022 A * | 12/2000 | Avidan | ..................... | 714/33 |
| 2002/0038446 A1 * | 3/2002 | Ioudovski | ..................... | 716/3 |
| 2005/0066298 A1 * | 3/2005 | Visweswariah | ..................... | 716/6 |
| 2005/0246116 A1 * | 11/2005 | Foreman et al. | ..................... | 702/69 |
| 2006/0010409 A1 * | 1/2006 | Tamaki et al. | ..................... | 716/6 |
| 2007/0016879 A1 * | 1/2007 | Kuo | ..................... | 716/4 |
| 2007/0016881 A1 * | 1/2007 | Gregory et al. | ..................... | 716/6 |
| 2007/0027569 A1 * | 2/2007 | Naya et al. | ..................... | 700/121 |

OTHER PUBLICATIONS

Bzowy, Dennis "LOCV: Location-based On-chip Variation" Agere Systems, Munich Germany, SNUG Europe 2004 (8 pages).
Orshansky, Michael; Milor, Linda; Chen, Pinhong; Keutzer, Kurt; Hu, Chenming "Impact of Spatial Intrachip Gate Length Variability on the Performance of High-Speed Digital Circuits" IEEE Transactions on Computer-Aided Design of Intergrated Circuits and Systems, vol. 21, No. 5, May 2002, (pp. 544-553).

* cited by examiner

*Primary Examiner*—Jack Chiang
*Assistant Examiner*—Suresh Memula
(74) *Attorney, Agent, or Firm*—Hamilton & Terrile, LLP; Stephen A. Terrile

(57) ABSTRACT

An apparatus, method and system for performing a race analysis on an integrated circuit design which includes incorporating effects of on-chip transistor gate length (Lgate) and resistance variations into the race analysis and modeling on circuit performance while taking into account intra-chip transistor Lgate spatial variability.

9 Claims, 5 Drawing Sheets

ON-CHIP VARIABILITY IMPACT SIMULATION AND ANALYSIS FOR CIRCUIT PERFORMANCE

BACKGROUND OF THE INVENTION

1. Field of the Invention

The present invention relates to semiconductor device manufacturing, and more specifically, to modeling and simulation of circuit performance degradation.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, as well as in the manufacture of integrated circuit devices incorporating such devices.

There is a trend toward high device densities within integrated circuit devices. To achieve these high device densities, small features on semiconductor wafers are required. To achieve these higher densities there have been, and continue to be, efforts toward scaling down device dimensions (e.g., at sub-micron levels) on semiconductor wafers. These may include the width and spacing of interconnecting lines, spacing and diameter of contact holes, and spacing and length of a MOS (metal oxide semiconductor) gate trace, which may have varying intra-chip lengths depending upon their position relative to the devices to which they are connected.

Progress in these manufacturing technologies comes at the cost of increased complexities in semiconductor processes, especially at sub-micron levels, which have attendant issues not previously addressed by prior design models and simulation methods. For example, systematic intra-chip spatial variability is a significant issue for chip designers, driving the need for more effective interaction between design models, simulation methods, and manufacturing techniques.

In complementary metal oxide semiconductor (CMOS) technologies, an important processing parameter affecting circuit performance is the gate length (Lgate) of a transistor. Spatial variations in Lgate affect circuit timing properties, which can lead to timing errors and performance loss.

Furthermore, significant and systematic, as opposed to minor and random, spatial intra-chip variability of transistor gate lengths, can lead to relatively large variations in circuit path delays. These large variations can result in circuit failure if variability is not properly addressed at the design stage. For example, the delay of the critical path of a combinational logic block can vary by as much as 17%, with global clock skew increasing by as much as 8%.

Thus intra-chip transistor Lgate variation can have a substantial and detrimental effect on overall circuit performance, resulting in races or hold time failures. Moreover, analysis indicates that spatial, rather than proximity-dependent, systematic transistor Lgate variability can be a major cause of circuit failure.

An estimation of such circuit failure could be calculated for given circuit and process parameters, based on individual device characteristics and the related effect of spatial dependence on their respective location within the chip. Furthermore, this detrimental effect of intra-chip transistor Lgate variability could be substantially mitigated in the semiconductor design phase, by accurately predicting the improvement of their respective operating characteristics by modeling changes in device location.

However, no such method currently exists for accurate modeling and simulation of the effect of intra-chip transistor Lgate spatial variability on circuit failure.

SUMMARY OF THE INVENTION

The method and apparatus of the present invention overcomes shortcomings of prior art through the use of a race analysis technique, incorporating the effects of on-chip transistor gate length (Lgate) and resistance variations, that can provide accurate modeling and simulation of the effect of intra-chip transistor Lgate spatial variability on circuit failure.

In one embodiment, the invention relates to a method for performing a race analysis on an integrated circuit design which includes incorporating effects of on-chip transistor gate length (Lgate) and resistance variations into the race analysis and modeling on circuit performance while taking into account intra-chip transistor Lgate spatial variability.

In another embodiment, the invention relates to an apparatus for performing a race analysis on an integrated circuit design which includes means for incorporating effects of on-chip transistor gate length (Lgate) and resistance variations into the race analysis and means for modeling on circuit performance while taking into account intra-chip transistor Lgate spatial variability.

In another embodiment, the invention relates to a system for performing a race analysis on an integrated circuit design which includes a gate length module wherein the gate length module incorporates effects of on-chip transistor gate length (Lgate) and resistance variations into the race analysis, and a modeling module wherein the modeling module models on circuit performance while taking into account intra-chip transistor Lgate spatial variability.

Clock insertion delays are used for race path analysis (i.e., hold time checking). For each potential race path, clock skew is determined as the difference between the largest insertion delay of the receiver clock node, and the smallest insertion delay of the transmitter clock node.

Pessimistic estimates of the effect of resistance variability are achieved by using the maximum resistance simulation results for the receiver and the minimum resistance simulation results for the transmitter. Clock skew is then computed for each of the four slant conditions and the largest skew number is used for hold time checking.

Thus, the method for modeling transistor on-chip gate length variability incorporates spatial location dependence into the clock network simulations.

Use of the present invention removes the effects of device orientation by examining each of four slants. In addition, the method of race analysis can include the combined effects of on-chip transistor gate length, and interconnect resistance variability. Moreover, use of the invention can introduce additional design conservatism, and can help identify potential race failures in the chip.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

The present invention provides an apparatus and method to conservatively check that the minimum delay between each pair of timing points (e.g., latches, flip flops, dynamic gates, and other logic) is great enough to guarantee that new data does not incorrectly race between these structures. The minimum allowable delay for each path is determined by the skew between the clock inputs to the sending and receiving timing points. In one embodiment, a list of paths is produced, with associated race problems, sorted in descending order or failure magnitude.

Figure 1:
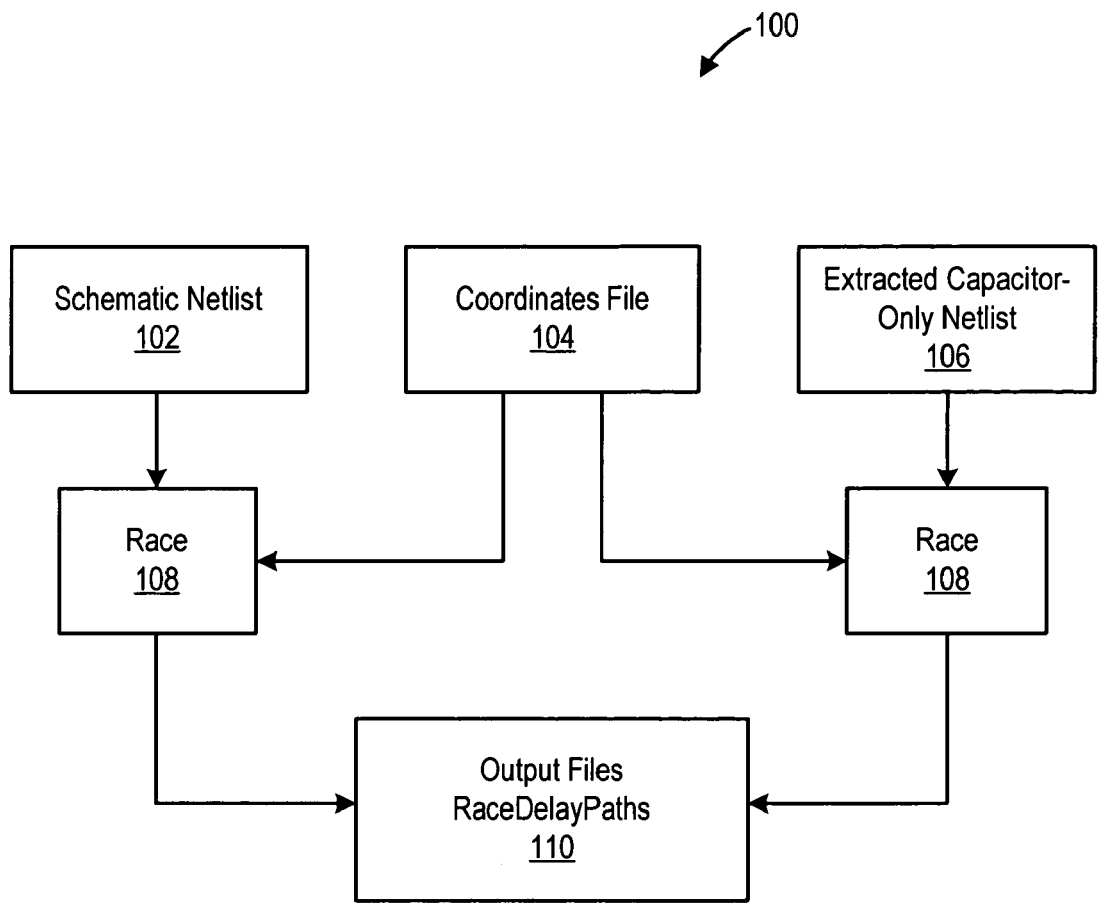
FIG. 1 shows a block diagram of a system for modeling and simulating circuit performance degradation.

Referring to FIG. 1, a block diagram of a system 100 for modeling and simulating circuit performance degradation is shown. During operation of the system 100, analyses can be run using schematic netlists 102 or extracted netlists 106. In addition, the user can specify a transistor coordinates file 104. At a minimum, the (x,y) coordinates of at least one transistor in each corner of a bounding box are specified. Each set of coordinates, defining a race 108, is analyzed. Primary analysis output files 110 contain paths with race violations (e.g., RaceDelayPaths.out). A race analysis can be performed at several stages during chip design. A first-pass analysis can be run on schematic netlists 102 with estimated interconnect capacitances. Once extracted data is available, the analysis can be repeated with accurate interconnect capacitances as illustrated in FIG. 1.

Figure 2:
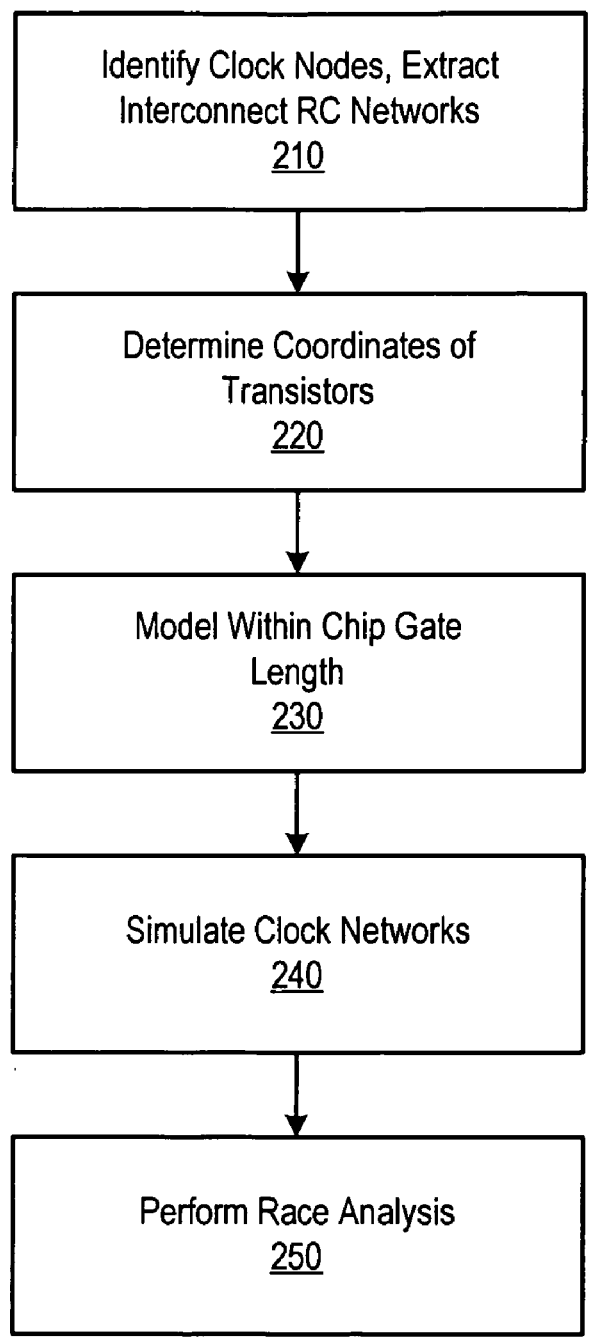
FIG. 2 shows a flowchart of the operation of the system for modeling and simulating circuit performance degradation.

Referring to FIG. 2, a flowchart of the operation of the system 100 for modeling and simulating circuit performance degradation is shown. More specifically, the system 100 starts execution by identifying clock nodes in a design at step 210. Next, coordinates of transistors in the layout are determined through existing layout versus schematic (LVS) techniques at step 220. Next, within-chip transistor Lgate variability is modeled by assuming that one corner of a rectangular region bounding a layout has transistors with the largest difference between drawn and effective electrical gate lengths (delta-L) at step 230. Next, a clock network is simulated using a gate length variability model to provide clock insertion delay at every timing point (e.g., latches, flip-flops, dynamic gates) at step 240. Next, a race path analysis (e.g., hold time checking) is performed, using clock insertion delays for each potential race path at step 250.

Figure 3:
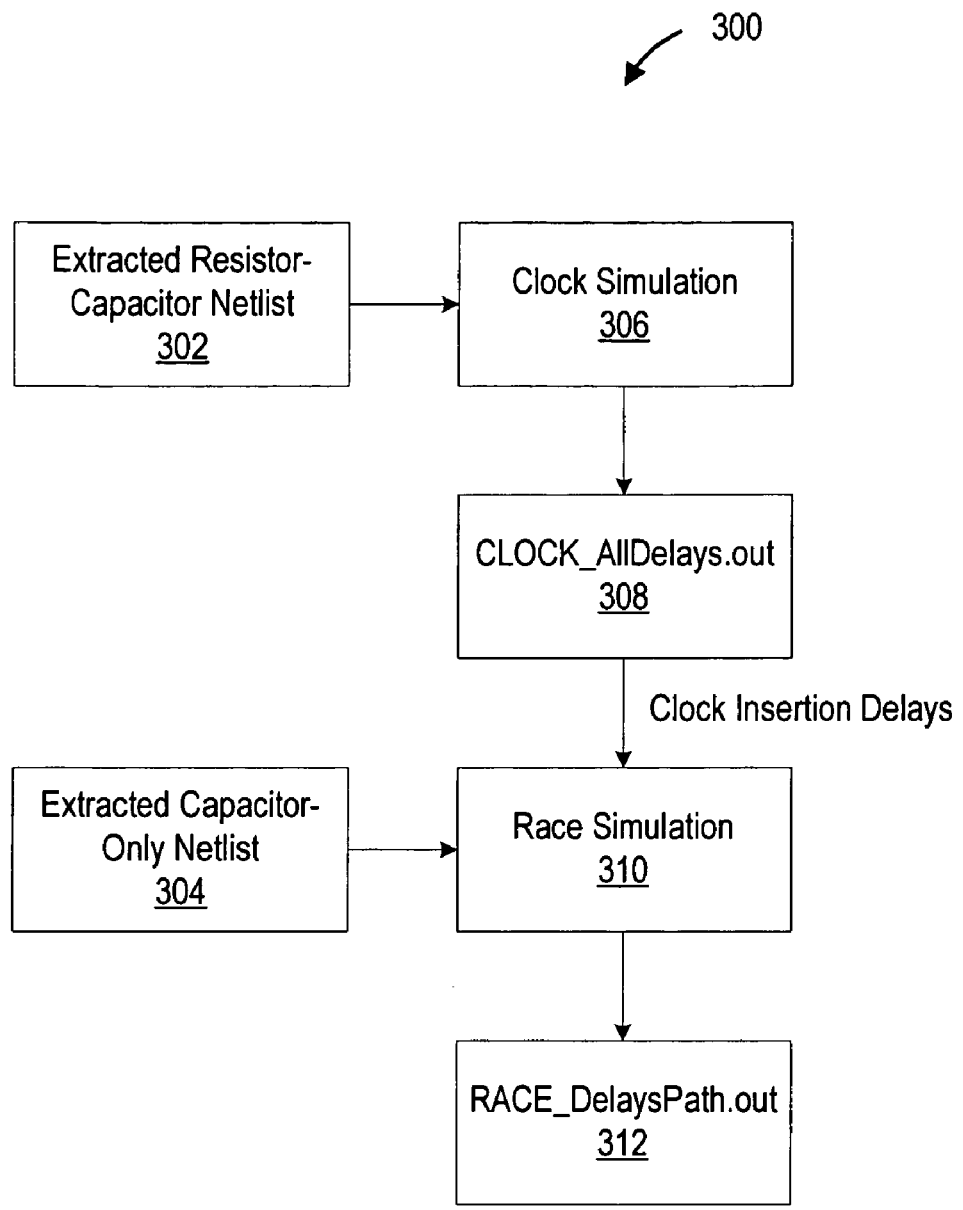
FIG. 3 shows a flowchart of the operation of a race analysis flow with simulated clock insertion delays.

Referring to FIG. 3, a flowchart of the operation of a race analysis flow 300 with simulated clock insertion delays is shown. With the race analysis flow 300, clock skews are based on the coordinates of sending and receiving clocks. This coordinate-based estimation uses file parameters describing clock skew variation in x- and y-directions.

More specifically, extracted resistor-capacitor (RC) netlists 302 are used to produce a clock network layout. Once a clock network has been laid out, clock simulations 306 can be performed to achieve more accurate clock insertion delays 308 for each clock node in the resistor-capacitor netlist 302. These simulated clock insertion delays 308 are used as inputs to compute the skew between the transmitting and receiving clock nodes, and extracted capacitor-only netlists 304, are used to produce race simulations 310.

Figure 4:
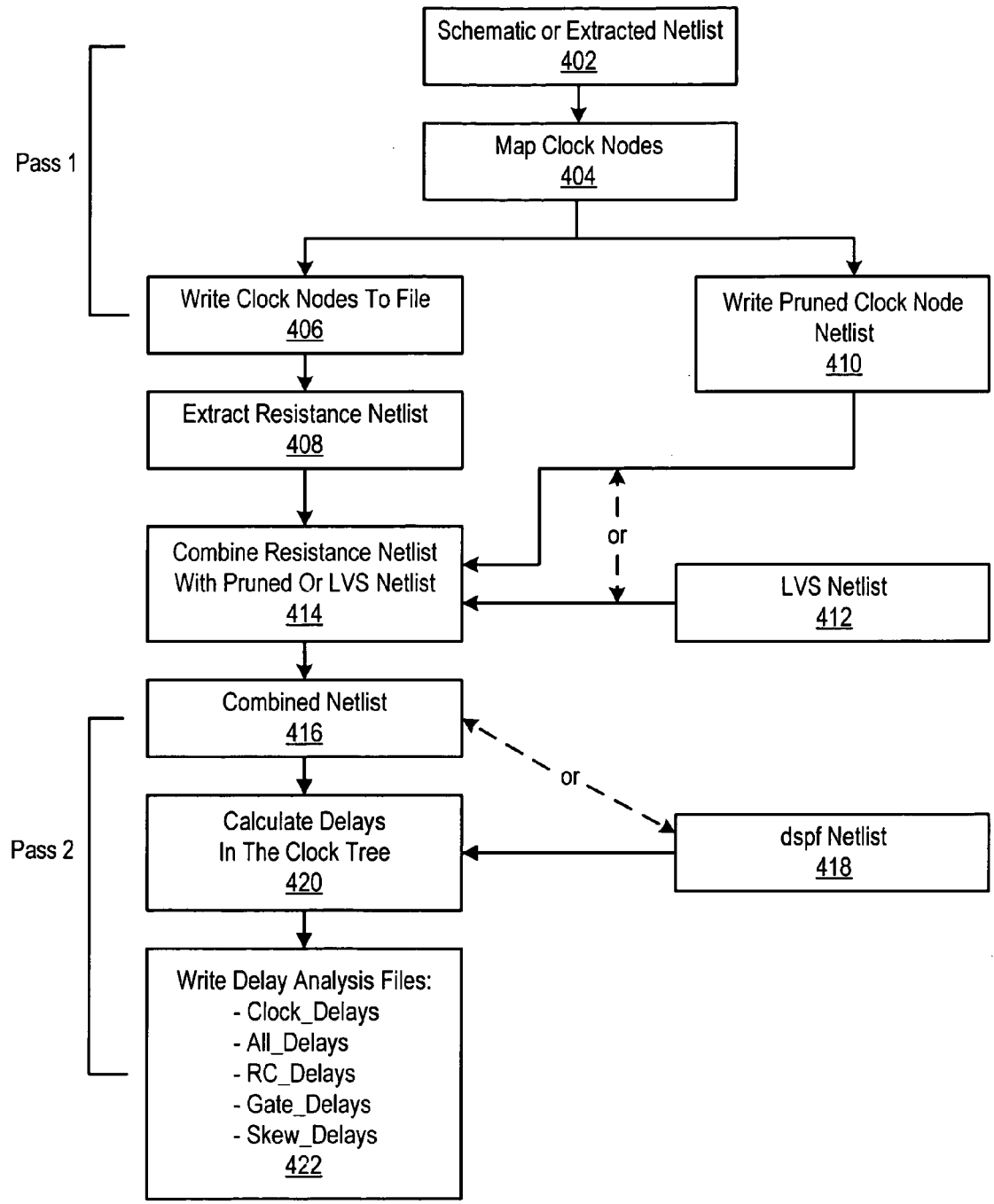
FIG. 4 shows a flowchart of calculation of delays and edge rates in a clock tree.

Referring to FIG. 4, a flowchart of calculation of delays and edge rates in a clock tree is shown. In one embodiment, two simulation passes are performed when using full-custom netlists to generate two different netlists.

During the first simulation pass, a schematic or extracted netlist can be used to identify, and then extract, clock nodes in a clock tree. In the second pass, a clock tree is simulated using an extracted netlist for resistors or a netlist in detailed standard parasitic format (dspf).

More specifically, execution of the first pass starts by a schematic or extracted (e.g., LVS, capacitor-only) netlist is acquired for a target circuit at step 402. Next, the system 100 identifies and maps clock nodes in a clock tree using a schematic or extracted netlist at step 404.

Next, a list of clock tree nodes are written to a clock nodes output file at step 406. Alternately, a "pruned" list of clock tree nodes are written to a pruned clock node netlist file in step 410. When the list of clock nodes are written to the clock nodes output file, a resistance netlist is extracted from a list of clock tree nodes at step 408.

Next, the resistance netlist extracted during step 408 is combined with a pruned clock node netlist from step 410 at step 414. Alternately, during step 414 data from the resistance netlist extracted in step 408 may be combined with data from an LVS netlist as acquired in step 412.

During the second simulation pass, a clock tree is simulated using an extracted netlist for resistors or a netlist in detailed standard parasitic format (dspf). More specifically, during step 416, the respective netlist data from step 414 is aggregated into a combined netlist. The combined netlist from step 414 is used to calculate delays in a clock tree of the target circuit. Next, a detailed standard parasitic format (dspf) netlist which was acquired in step 418 is used to calculate delays in a clock tree of the target circuit at step step 420.

Next, results of the clock delay simulation are written as a plurality of files at step 422. The plurality of files can include a Clock_Delays file, which contains delays from the global node to termination nodes in the global or local clock tree; an All_Delays file, which contains all delays from the global clock node to every gate in the clock tree (including delays to the input pins of the hierarchical block for dspf netlists); an RC_Delays file, which contains delays from the node connected to the source/drain of a channel connected region (CCR) to the node attached to the gate of the receiving CCR; a Gate_Delays file, which contains delays from the node attached to the gate of the CCR to a node attached to its source/drain; a Skew_Delays file, which contains the skew calculated between pairs of sending and receiving latches.

Figure 5:
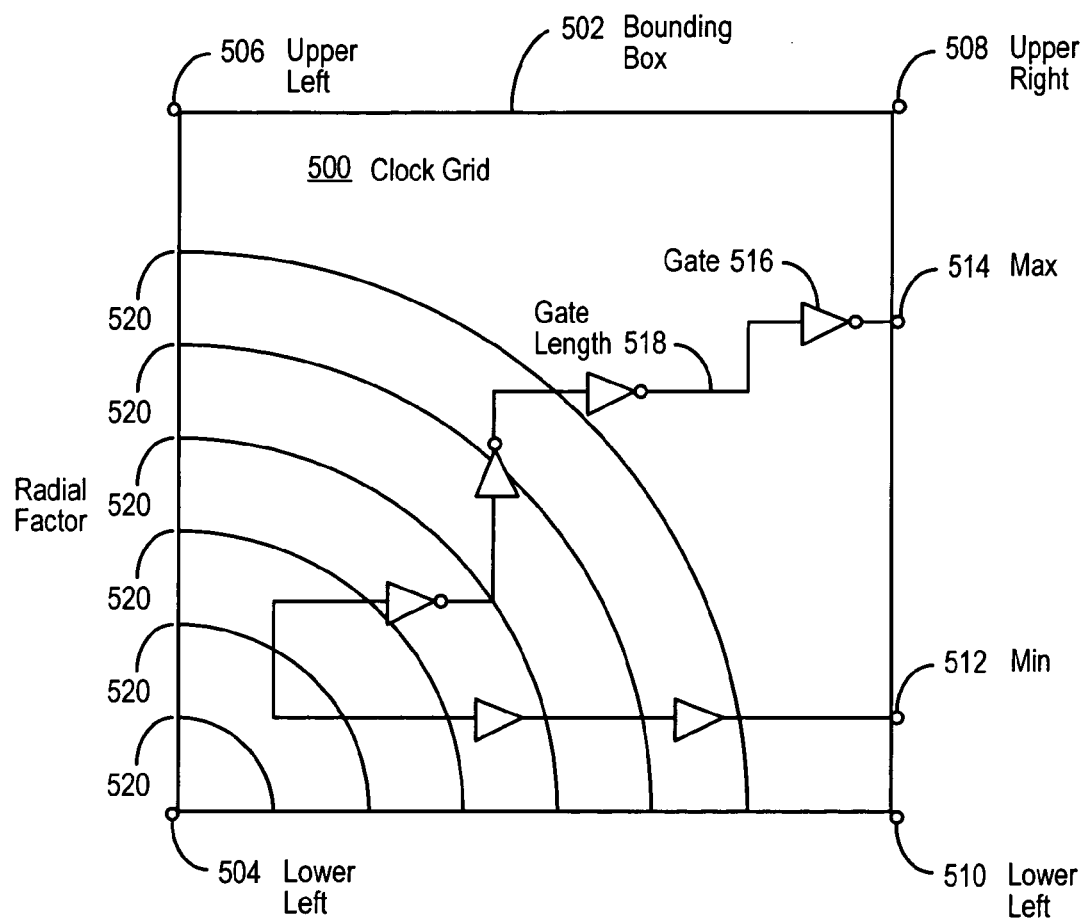
FIG. 5 shows a diagrammatic illustration of how a clock network is simulated using a gate length variability model.

Referring to FIG. 5, a diagrammatic illustration of how a clock network is simulated using a gate length variability model is shown. The system 100 supports the analysis of a clock grid 500 with a process slant by providing parameters which cause transistor widths to change as a function of distance from one of the chip corners.

More specifically, the simulation is performed using four "slant" conditions corresponding to the largest transistor gate length 518 (delta-L) at each corner of a bounding box 502; lower-left 504, upper-left 506, upper-right 508, lower-right 510. For each case, simulations are performed with minimum 512 and maximum 514 resistance netlists, resulting in a total of eight simulation runs. Reducing transistor widths are balanced by increases in the fixed capacitance of the gate 514 to keep the total gate capacitance the same as the width changes.

The process slant is specified by defining the starting corner for the slant as lower-left 504, upper-left 506, upper-right 508, or lower-right 510, a starting transistor width multiplier, and a process slant slope.

Rather than slanting the transistor length, its width is varied to effectively produce the same change in transistor drive current. This is done since some circuit simulation models for transistors are characterized only for discrete lengths. The width of a transistor located at the starting corner is equal to the starting width multiplier times the original transistor width. The width multiplier changes radially 520 away from the starting corner with a slope equal to the process slant slope. For instance, if the process slant slope is 0.35/6000, a transistor 1800 microns away from the starting corner will have a width multiplier of 0.895.

Those knowledgeable in the art will recognize that the examples set forth are not all-inclusive and that many other methods, including combinations of, and extensions to, the examples referenced are possible.

The present invention provides a method and apparatus for accurate modeling and simulation of the effect of intra-chip transistor Lgate spatial variability on circuit performance degradation by incorporating spatial location dependence into clock network simulations. Furthermore, use of the present invention can provide an estimation of circuit performance degradation for given circuit and process parameters, based on individual device characteristics and the related effect of their respective location within the chip. Moreover, use of the invention can substantially mitigate the detrimental affect of intra-chip transistor Lgate variability in the semiconductor design phase, by accurately predicting improvements in operating characteristics by modeling changes in device location.

Although the present invention has been described in detail, it should be understood that various changes, substitutions and alterations can be made hereto without departing from the spirit and scope of the invention as defined by the appended claims.

What is claimed is:

1. A method for performing a race analysis on an integrated circuit design comprising:
    incorporating effects of on-chip transistor gate length (Lgate) and resistance variations into the race analysis;
    modeling on circuit performance while taking into account intra-chip transistor Lgate spatial variability;
    beginning with identification of clock nodes in the integrated circuit design;
    extracting pertinent interconnect resistance-capacitance (RC) networks, the extracting using a parasitic extraction;
    determining coordinates of transistors in the integrated circuit design; and
    providing process technology files corresponding to a minimum resistance and a maximum resistance as input for the parasitic extraction.

2. The method of claim 1 wherein the parasitic extraction results in generating two netlists.

3. The method of claim 1 wherein the coordinates are determined using a layout versus schematic (LVS) technique.

4. An apparatus for performing a race analysis on an integrated circuit design comprising:
    means for incorporating effects of on-chip transistor gate length (Lgate) and resistance variations into the race analysis; and
    means for modeling on circuit performance while taking into account intra-chip transistor Lgate spatial variability;
    means for beginning with identification of clock nodes in the integrated circuit design;
    means for extracting pertinent interconnect resistance-capacitance (RC) networks, the extracting including a parasitic extraction;
    means for determining coordinates of transistors in the integrated circuit design; and
    means for providing process technology files corresponding to a minimum resistance and a maximum resistance as input for the parasitic extraction.

5. The apparatus of claim 4 wherein the parasitic extraction results in generating two netlists.

6. The apparatus of claim 4 wherein the coordinates are determined using a layout versus schematic (LVS) technique.

7. A system for performing a race analysis on an integrated circuit design comprising:
    a gate length module, the gate length module incorporating effects of on-chip transistor gate length (Lgate) and resistance variations into the race analysis; and,
    a modeling module, the modeling module modeling on circuit performance while taking into account intra-chip transistor Lgate spatial variability;
    an identification module, the identification module beginning with identification of clock nodes in the integrated circuit design;
    an extracting module, the extracting module for extracting pertinent interconnect resistance-capacitance (RC) networks, the extracting including using parasitic extraction;
    a coordinates module, the coordinates module for determining coordinates of transistors in the integrated circuit design; and wherein
    the process technology files are provided as input for the parasitic extraction for providing process technology files corresponding to a minimum resistance and a maximum resistance.

8. The system of claim 7 wherein the parasitic extraction results in generating two netlists.

9. The system of claim 7 wherein the coordinates are determined using a layout versus schematic (LVS) technique.

* * * * *